Dec. 16, 1958 R. F. WOOLLEY 2,864,332
CRYSTAL PLATING APPARATUS
Filed Sept. 6, 1957

INVENTOR,
RAYMOND F. WOOLLEY.
BY
Harry M. Saragovitz
ATTORNEY.

United States Patent Office 2,864,332

Patented Dec. 16, 1958

2,864,332

CRYSTAL PLATING APPARATUS

Raymond F. Woolley, Wanamassa, N. J., assignor to the United States of America as represented by the Secretary of the Army Application September 6, 1957, Serial No. 682,559

1 Claim. (Cl. 118—49)

(Granted under Title 35, U. S. Code (1952), sec. 266)

The invention described herein may be manufactured and used by or for the Government for governmental purposes without the payment of any royalty thereon.

The present invention relates to the plating of piezoelectric crystals, and more particularly to a jig for holding the crystal during the plating process, i. e., the application of a metallic electrode on the surface thereof. Such metallic electrodes are necessarily in the form of extremely thin metal films deposited directly on the crystal. In the past, various methods have been devised for affixing such thin metal electrodes such as by spraying and baking, but, in general, it has been discovered that the most advantageous method of applying such electrodes is by evaporating the desired metal in vacuum and allowing it to condense on the exposed surface or surfaces of the crystal as desired. The techniques developed to date in applying such electrodes by the last mentioned method includes base plating the crystal in a keyhole pattern and applying a spot plating to one side of the crystal while the crystal is connected to a test oscillator circuit to bring it to a prescribed frequency.

As presently practiced, such method utilizes a plating jig wherein during the plating step, the crystal base leads extend through the base of the evacuated chamber, or bell jar, to connect with the test oscillator. However, it has been found that at very high frequencies, from 50 to 100 mc., for example, the undue length of these leads, from the oscillator to the crystal introduce errors in frequency and resonance resistance of the crystal unit.

It is therefore the primary object of the present invention to provide a crystal plating jig wherein the errors in frequency introduced by such long leads as heretofore prevalent in devices of the prior art are reduced to a negligible minimum. This is particularly true in the cases of crystals that operate in the range of from 50 to 100 mc. Any attempts to shorten the leads from the oscillator to the crystal, such as by positioning the oscillator into the base of the plating jig have been found impractical and in most instances impossible because of other equipments such as a diffusion pump necessary to evacuate the device being located in or adjacent to the base of the plating jig.

I have found that by relocating the oscillator unit and by a new alignment and positioning of the crystal socket within the bell jar such lead lines can be reduced to an absolute minimum thereby avoiding any of the errors in frequency usually associated with longer lead lines.

Figure 1:
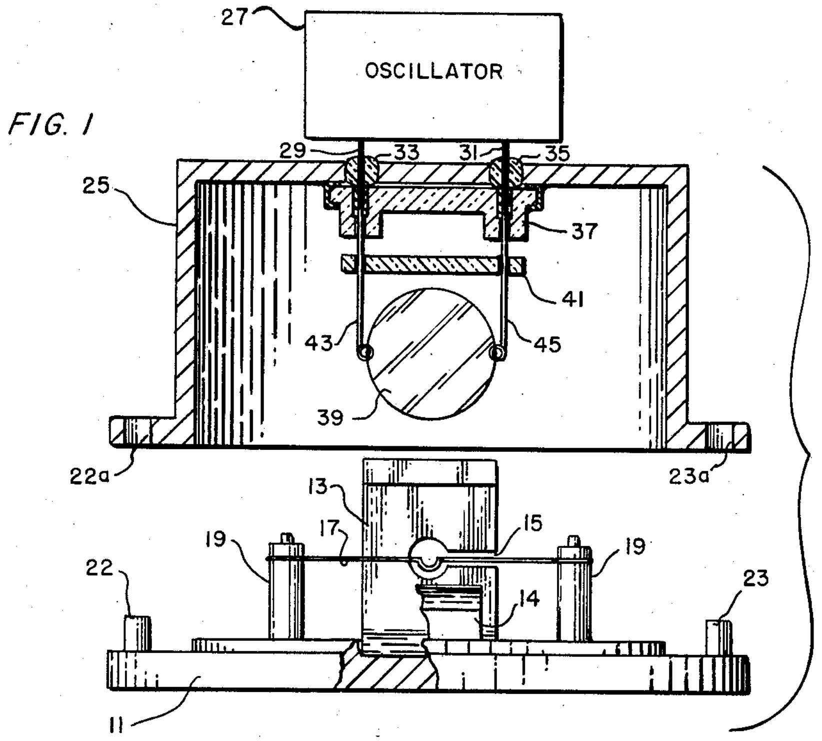
Figure 2:
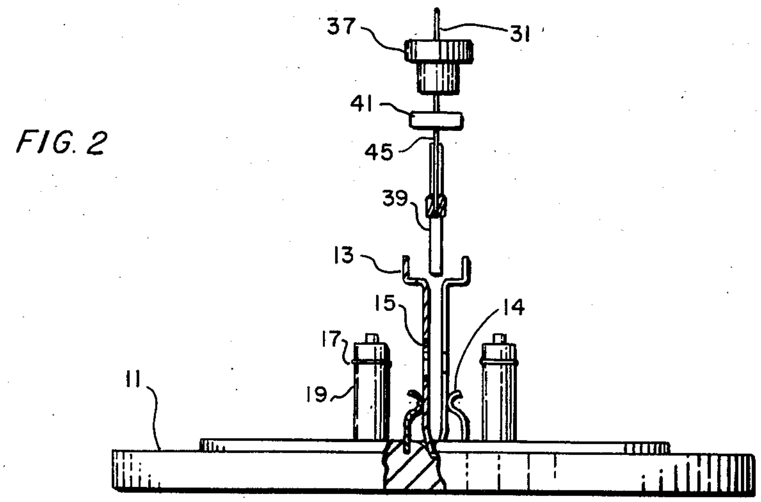

The invention can best be understood from the following description taken in view of the accompanying drawing, wherein Fig. 1 is an exploded view of the newly designed crystal holding jig, and Fig. 2 is an end view of the jig shown in Fig. 1.

Referring to the drawing in Fig. 1 there is shown the crystal plating jig including a base plate 11 which serves as a means for supporting the masking means 13 perpendicularly disposed to the base 11 and provided with a keyhole cutout 15 of a desired configuration, that is, the contour of the electrode to be affixed to the crystal. The mask is supported by spring clamps 14. For evaporating the desired metal on to the crystal there is provided the filament 17 which is supported between pairs of posts 19 disposed on either side of the mask 13. The electrical circuitry connected to the filament 17 is not shown herein as such circuitry is well known in the prior art. Located at oppositely disposed points on the base 11 are a pair of positioning studs 22 and 23 which serve as a means for aligning and holding in position the bell jar chamber 25 which has a flanged rim having openings **22*a*, 23*a* which mate with their respective studs. Also, not shown in the drawing is the diffusion pump which ordinarily would be affixed to some portion of the base to evacuate the bell jar chamber 25 when it is in position and integrally secured to the base 11. The chamber 25 is preferably circular in configuration and substantially U-shaped as a common bell jar. To the top of the bell jar 25, or spaced immediately above it, is placed an oscillator shown as a block 27. The oscillator 27 is provided with lead lines 29, 31 which are introduced into the interior of the jar thru conventional glass-to-ceramic seals 33 and 35 respectively. Secured to the inner surface of the jar 25 and immediately below the oscillator 27 is a conventional crystal socket 37. The leads 29, 31 from the oscillator terminate in socket 37. The crystal to be plated is shown at 39 and its assembly includes the crystal holdler 41 and contact prongs 43, 45. In the exemplification shown in Fig. 1 the oscillator 27** is shown as being slightly spaced from the top of the bell jar. However, in actual practice such oscillator can be placed in physical intimate engagement with the top of the bell jar and rest thereon and spaced a short distance away from the top of the bell jar. It is thus readily apparent that the lead lines from the oscillator to the crystal by the arrangement described above are extremely small as compared to the prior art devices where oscillator lead lines may be of considerable length that is in the range up to as high as six inches. It is thus readily apparent that by the practice of the invention herein the errors in the frequency attributed to the long lead lines of the prior art devices are almost completely eliminated by the device herein described.

What is claimed is:

In a crystal plating apparatus including a base and a bell jar adapted to be hermetically sealed to said base, a mask mounted on said base and means for depositing a metallic coating on a crystal, the improvement comprising a mount for supporting said crystal in alignment with said mask affixed to the underside of the top of said jar and an oscillator positioned immediately above the jar having leads extending through openings in said jar to said crystal mount.

References Cited in the file of this patent

UNITED STATES PATENTS

| | | |
|---|---|---|
| 2,100,045 | Alexander | Nov. 23, 1937 |
| 2,505,370 | Sykes | Apr. 25, 1950 |